United States Patent
Boss et al.

(10) Patent No.: US 6,965,242 B2
(45) Date of Patent: Nov. 15, 2005

(54) PROCEDURE AND APPARATUS FOR THE DETERMINATION OF THE NOISE LEVEL OF AN ELECTRONIC OBJECT TO BE MEASURED

(75) Inventors: Hermann Boss, Holzkirchen (DE); Kurt Schmidt, Grafing (DE); Markus Freidhof, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 14 days.

(21) Appl. No.: 10/607,751

(22) Filed: Jun. 27, 2003

(65) Prior Publication Data

US 2004/0066203 A1 Apr. 8, 2004

(30) Foreign Application Priority Data

Jun. 28, 2002 (DE) .......................... 102 29 127
Nov. 11, 2002 (DE) .......................... 102 52 300
Jan. 22, 2003 (DE) .......................... 103 02 362

(51) Int. Cl.$^7$ ............................. G01R 29/26
(52) U.S. Cl. ......................... 324/614; 702/69
(58) Field of Search ................ 324/613, 614; 702/65, 69, 195

(56) References Cited

U.S. PATENT DOCUMENTS

| 5,191,294 A | * | 3/1993 | Grace et al. ................. 324/613 |
| 6,032,026 A | * | 2/2000 | Seki et al. .................. 455/63.1 |
| 6,114,858 A | * | 9/2000 | Kasten ........................ 324/616 |

FOREIGN PATENT DOCUMENTS

| DE | 20 19 435 A | | 11/1971 |
| DE | 38 86 107 T2 | | 12/1988 |
| DE | 41 22 189 A1 | | 1/1993 |
| DE | 4122189 | * | 11/1993 |
| EP | 0 296 822 B1 | | 12/1988 |

* cited by examiner

*Primary Examiner*—Vincent Q. Nguyen
*Assistant Examiner*—Jeff Natalini
(74) *Attorney, Agent, or Firm*—Caesar, Rivise, Bernstein, Cohen & Pokotilow, Ltd.

(57) ABSTRACT

An apparatus for the determination of the magnitude of a noise ($T_{DUT}$) of an electronic object to be measured (2) includes a sine signal source (1), which generates a sine signal ($S_{in}$) for input into said object to be measured (2) and a level meter (3) for the measurement of a power level at the output of the said object to be measured (2). In accord with the invention, the level meter (3) possesses a sine power detector device (31) for the capture of a sine power level ($\hat{P}_{sin}$) and has a noise power level detector device (32) for a separate capture of a noise power level ($\hat{P}_{noise}$).

19 Claims, 5 Drawing Sheets

PROCEDURE AND APPARATUS FOR THE DETERMINATION OF THE NOISE LEVEL OF AN ELECTRONIC OBJECT TO BE MEASURED

BACKGROUND OF THE INVENTION

The invention concerns a procedure and an apparatus for determining the extent of the noise level of an electronic object to be measured.

Disclosed by DE 41 22 189 A1 is a procedure and an apparatus for the determination of the noise temperature of an electronic object to be measured. Contrary to the conventional means of procedure up to now, instead of a noise source, a sine signal was input into the measured object and by means of a level meter, the power was measured. The sine-signal source can be toggled between two power levels. These input power levels $P_1$ and $P_2$ are known with great accuracy. During a calibration, first, the inherent noise-power levels $P_{1K}$ and $P_{2K}$ were measured, since the sine-signal source is connected directly to the level meter without an interposed switching of the measured object. When this is carried out, the two connectable power levels $P_1$ and $P_2$ are applied to the sine signal source. During the actual measurement, the same power levels $P_1$ and $P_2$ were connected to the input of the measured object, and the outputs of the measured object were connected to the level meter, whereby, the corresponding power levels $P_{1M}$ and $P_{2M}$ can be read off from the level meter.

In the patent claim 1 of DE 41 22 189 A1 is given a formula for the computation of the noise-temperature $T_M$ as related to the magnitude of these measured values. In the numbers of this formula, are found the differences $P_{2M}-P_{2K}$ and $P_{1K}-P_{1M}$. At this time, the sum of the noise power and the power of that sine signal which is superimposed on the noise signal are measured by the level meter. The then acquired differences differ from zero, as long as the sine signal and the noise signal have approximately the same level. Should however, the sine signal dominate in the superimposed signal mix, then these differences scarcely differ between one another from zero, since these, with the calibration and with the actual measured power level, differ in the noise signal portion. This difference, however, can scarcely be evaluated, in taking the difference because of the dominating portion of the sine signal. The described procedure in DE 41 22 189 A1 is only adaptable when the power portion of the sine signal has the general magnitude of the noise power.

In the practice, however, there is a need, of evaluating measured objects in the activated state. For instance, the noise temperature of an amplifier is of interest not only in stand-by operation, but most surely, also in the case of high modulation, such as is the case with amplifiers in practical operations. To this end, it becomes necessary that the measured object, for instance, an amplifier, by modulated with a sine-signal having a relatively high level, so that the object under measurement is sufficiently modulated for this measurement. Such measurements are, however, not possible with the procedure described in DE 41 22 189 A1, due to the reasons set forth above.

Thus, the invention has the purpose, of making available a procedure and an apparatus for the determination of the degree of noise of an electronic object being measured, which enables a determination of the level of the noise even in the case of high modulation of the object to be measured.

SUMMARY OF THE INVENTION

The basis of the invention, is that it is to advantage, in measuring intensity of noise, to determine the value of the sine power level and the noise power level separately. This enables an essentially more exact measurement, of both the noise temperature as well as a simultaneous measurement of the amplification factor of the object being measured. It is particularly favorable that the object being measured, when excited by a sine signal, can be measured at a relatively high level. For instance, the noise factor of an amplifier can be measured in a fully modulated condition.

The sine-power level can be obtained by means of arithmetical averaging of the sampled values and subsequent squaring of the amount of the said arithmetical average. The noise power level is available, on the other hand, by means of arithmetical averaging of the square of the amount of the sampled values, and subsequent subtraction of the sine power level.

Advantageous is also an estimation by a local oscillator using signal conversion and corrective procedure of a possible deviation of the frequency of the sine signal input in the measured object from a signal existing in the level meter, Normally, the local oscillator of the level meter has a frequency, which is offset when compared to the external source of the sine signal. This frequency offset can be correspondingly corrected.

The noise temperature can, by means of the formulae provided in the subordinate claims be determined either directly or by consideration of a prior calibration.

BRIEF DESCRIPTION OF SEVERAL VIEWS OF THE DRAWINGS

The invention will be explained in greater detail with reference to the drawings. In the drawings, the following figures. show.

DETAILED DESCRIPTION OF THE INVENTION

Figure 12:
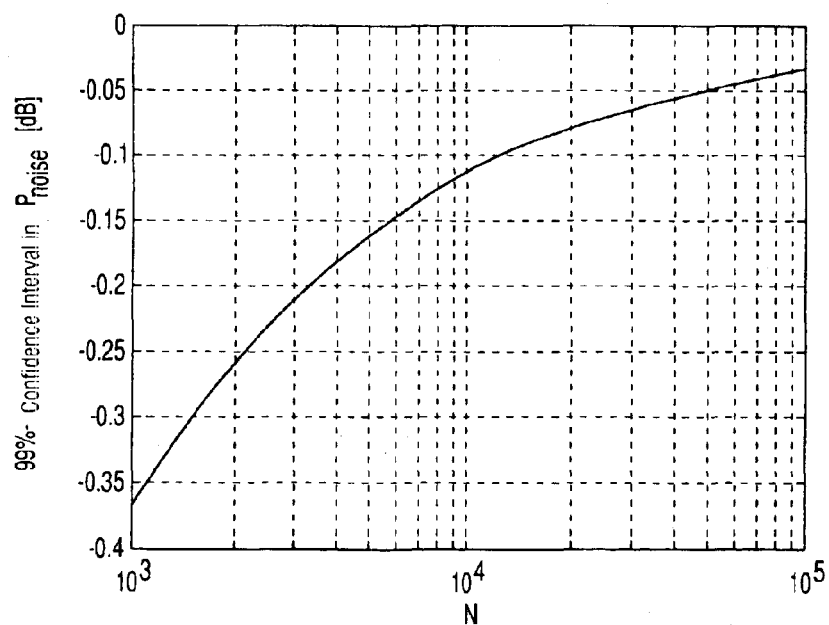

Before the procedure for the invented measurement procedure and the measurement apparatus are discussed, in the following, for a better eventual understanding of the invention, some of the basics of the noise measurement and the procedure by the state of the technology will be explained in keeping with the FIGS. 1 to 6. An embodiment example of the invented measurement apparatus can then be investigated with reference to the FIGS. 10 and 11. FIG. 12 depicts the high exactness of the measurement capability of the invented procedure. The evaluation with the invented measurement procedure will then, subsequently be carried out with the FIGS. 7 to 9.

Figure 1:
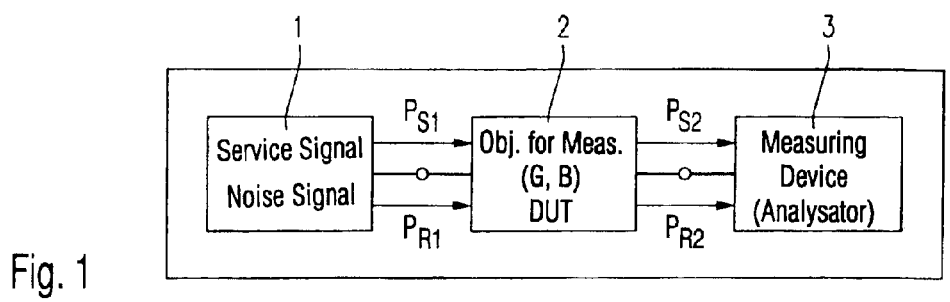
FIG. 1 a block circuit/logic diagram for a more enhanced explanation of the definition of the noise factor, FIG. 2 an equivalent circuit/logic diagram for a more enhanced explanation of the definition of the noise factor, FIG. 3 a signal model of the explanation of the noise measurement, FIG. 4 an equivalent circuit/logic diagram for the explanation of the Y-factor measurement FIG. 5 an equivalent circuit/logic diagram for the explanation of the calibration, FIG. 6 an equivalent circuit/logic diagram for the explanation of the calibrated measurement in accord with the state of the technology, FIG. 7 an equivalent circuit/logic diagram for the explanation of the invented measurement, without calibration, FIG. 8 an equivalent circuit/logic diagram for the explanation of the invented calibration, FIG. 9 an equivalent circuit/logic diagram for the invented measurement with calibration, FIG. 10 an equivalent block diagram of the invented measurement apparatus, FIG. 11 a detailed block circuit/logic diagram of the invented measurement apparatus and FIG. 12 a presentation of the 99% confidence interval of $\hat{P}_{noise}$ as a function of the number N of the sampled values.

FIG. 1 is a block circuit/logic diagram for the explanation of the definition of the noise factor, which, together with the noise temperature serves as one of possible noise magnitudes for the description of a noise model. With the circuit/logic diagram of FIG. 1, from a signal source 1, either a service signal $P_{S1}$ or a noise signal $P_{R1}$ is input into an object to be measured (i.e., DUT=Device Under Test) 2. In the case of the service signal, this can be, for instance, a sine signal. The service signal $P_{S2}$ at the output of the object to be measured 2 and the noise signal $P_{R2}$ at the output of the object to be measured 2 is evaluated by a measuring apparatus 3, which can designated also as an analyzer or a level meter. In this sequence, attention must be given to the fact, that the values $P_{S1}$, $P_{R1}$, $P_{S2}$ and $P_{R2}$ respectively represent power level.

The noise factor F of the object to be measured (DUT) is defined as:

$$F = \frac{\text{Signal} - \text{noise ratio } (DUT \text{ input})}{\text{Signal} - \text{noise ratio } (DUT \text{ output})} = \frac{P_{S1}/P_{R1}}{P_{S2}/P_{R2}} \quad (1)$$

From this is derived the noise factor of $NF=10 \cdot \log_{10}(F)$ [dB].

Figure 2:
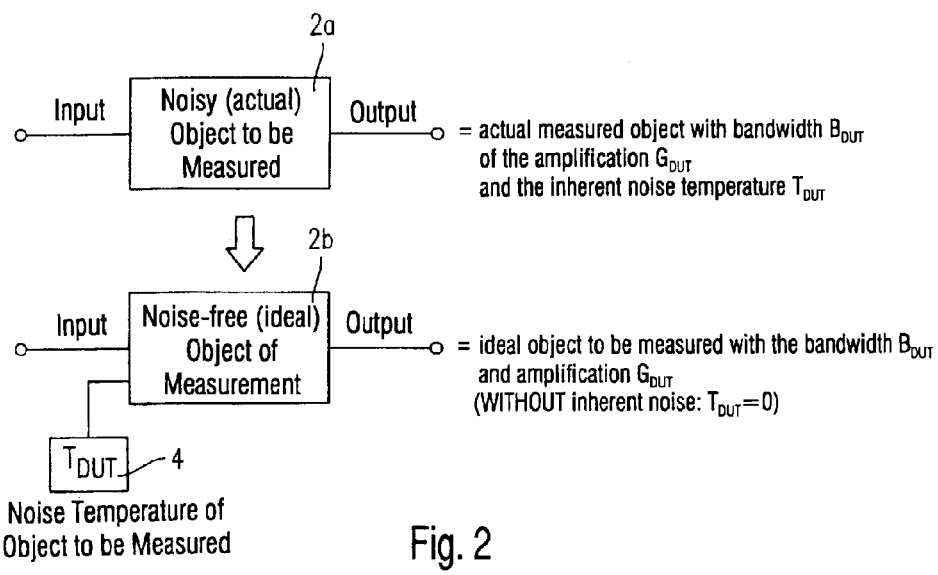

In order to determine the noise factor, in a practical manner, the model of FIG. 2 can be used as a starting point. A noisy object to be measured 2a, is replaced by a noise-free, ideal object to be measured 2b with a noise source 4 at in the input, and which has the noise temperature $T_{DUT}$.

Since the noise of an object to be measured 2 is of a thermal nature, this can be simulated by a so-called noise temperature. The noise power permits itself to be computed from the noise temperature by the following calculation:

$$P_{DUT}=k \cdot T_{DUT} \cdot B_{DUT} \quad (2)$$

where $k=1.38 \cdot 10^{-23} Ws/K$ (Boltzmann Constant)

The power values in FIG. 1 then yield:

---

$P_{S1}$ = service signal $P_{S2} = P_{S1} \cdot G_{DUT}$ $P_{R1} = k \cdot T_{\text{Noise Signal}} \cdot B_{\text{Noise Signal}}$  where $T_{\text{Noise Signal}} = T_0$ $P_{R2} = (P_{R1} + k \cdot T_{DUT} \cdot B_{DUT}) \cdot G_{DUT}$  where $B_{\text{Noise Signal}} > B_{DUT}$

---

For the definition of the physical sizes, refer to FIG. 2. With the given definition, one can compute therefrom the noise factor F:

$$F_{DUT} = \frac{T_{DUT} + T_o}{T_o}, \text{ where } T_o = 260K \quad (3)$$

In order to be able to compare noise factors, an ambient temperature of $T_0=290$ K was used as the reference temperature. The assumption, that the noise power $P_{R1}$ corresponds to a noise temperature of $T_0$, is the modeled opinion, that the object for measurement (DUT) 2 at the input has ambient noise present.

Figure 3:
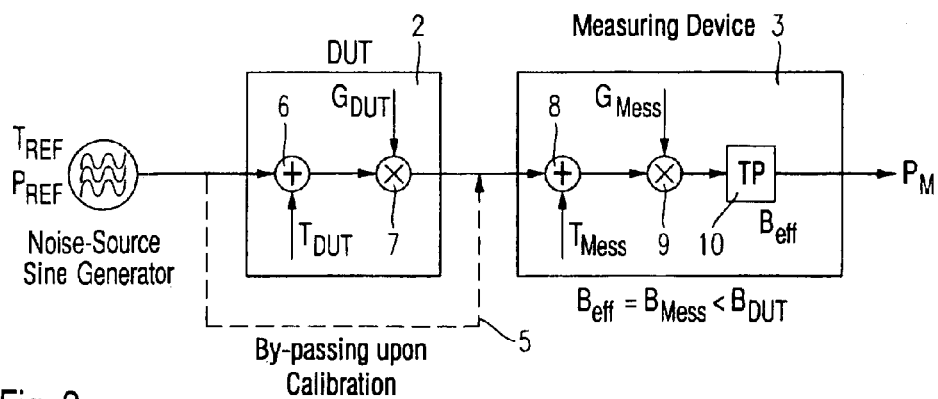

FIG. 3 shows a signal model of the noise measurement. A combination source 1 for a sine signal and a noise signal is connected to the measurement equipment 3 by the object to be measured 2. If, before the actual measuring, a calibration is undertaken, then the object to be measured 2, as is indicated by the dashed line 5, is bypassed at the calibration. In the equivalent diagram of the object to be measured 2, the noise of the said object to be measured 2 is added in an adding device 6 and then together with the input signal, reinforced by multiplication with the amplification factor $G_{DUT}$ in the multiplier 7.

The equipment for measurement, i.e., the level meter, 3 is modeled in a similar manner. The inherent noise of the level meter 3 is added in an adder 8 and the signal of the sum is amplified by multiplication with the amplification factor $G_{MESS}$ in the multiplier 9. The measurement band width of the level meter is modeled through a deep pass 10 with the bandwidth $B_{\textit{eff}} = B_{MESS} < B_{DUT}$, wherein, $B_{\textit{eff}}$ is the effective band width, $B_{MESS}$ is the measurement bandwith, and $B_{DUT}$ the bandbreadth of the object to be measured 2. The measuring equipment, that is the level meter 3 delivers the power level $P_M$.

The explanation immediately above can be mathematically shown by:

$$T_{hot} = \left(10^{\frac{ENR}{10}} + 1\right) \cdot T_o \quad (4)$$

$$F_{DUT} = \frac{T_{DUT} + T_o}{T_o} \text{ and } NF_{DUT} = 10 \cdot \log_{10}(F)$$

wherein

| | |
|---|---|
| $T_0$ | reference temperature (290 K.) |
| F | Noise Factor (linear) |
| NF | Noise Factor (logarithmic) |
| ENR | Noise power of the noise source (log.; relative to $T_0$) |
| $T_{DUT}$ | Inherent noise temperature of the object to be measured 2 |
| $T_{cold}$ | Temperature of an out-of-circuit noise source (ambient temperature) |
| $T_{hot}$ | Temperature of the in-circuit noise source |

All noise powers are employed as linear measurement values. In the following, a universal signal model of the noise measurement is provided, with which all measurement cases can be covered In general, this relationship is valid:

$$P_{REF}=k \cdot B_{\textit{eff}} \cdot T_{REF} \quad (5)$$

(here only the bandwidth is considered, which the measuring device 3 sees) and $$P_M=P_{CAL} \text{ or } P_{MESS} \quad (6)$$

(respectively with an in-circuit/out-of-circuit reference source)

The bandwidth of the object to be measured can be ignored in this observation, since the bandwidth of the measuring apparatus 3 is, as a rule, smaller. The noise source or the sine source is designated as a reference source, since the levels of these are presupposed to be exactly known. Upon applying the above considerations, it is easily seen, that in the calibration with two different reference levels, the measurement values $T_{MESS}$ and $G_{MESS}$ were determined. In the case of the subsequent measurement (again with two different reference levels) the values of $T_{DUT}$ and $G_{DUT}$ were established.

Upon the application of a sine signal as a reference source, then, for the measurement of the total power of sine signal and noise signal in the measurement apparatus, an RMS (root mean square) detector must be employed.

The exactness of the measurement of the noise power of interest is impaired with the increase of the signal/noise ratio (S/N) (between the sine and the noise signal). This fact can be illustrated as follows: In the following examples, the level quotient of the sum of the noise level and generator level is calculated to the generator level for various generator level values. The noise level is held constant.

EXAMPLE 1

Measurement case in accord with application DE 41 22 189 A1

| | |
|---|---|
| Noise power = | −110 dBm |
| Generator level = | −100 dBm |
| Total power = | −110 dBm + (−100 dBm) = −99.6 dBm |

$$T_{hot} = \frac{P_1}{k \cdot B_M}; \Rightarrow \text{Power difference} \approx 0.4 \text{ dB}$$

EXAMPLE 2

| | |
|---|---|
| Noise power = | −110 dBm |
| Generator level = | −80 dBm |
| Total power = | −110 dBm + (−80 dBm) = −79.996 dBm |

$\Rightarrow$ Power difference $\approx$ 0.004 dB

EXAMPLE 3

| | |
|---|---|
| Noise power = | −110 dBm |
| Generator level = | −10 dBm |
| Total power = | −110 dBm + (−10 dBm) = −9.9999999996 dBm |

$\Rightarrow$ Power difference $\approx$ 0.0000000004 dB

The exactness achieved in regard to the power measurement, is dependent upon the length of observational time, which consists of N sampling values. This error mist essentially be less than the power difference which is to be determined, (see Example 1) to Example 3). It is to be recognized, that a measurement, as was done in Example 1, with a power level used in accord with the state of the technology (DE 41 22 189 A1) can be well carried out, since the level difference at about 0.4 dB is easily measured. The Examples 2 and 3 are, in comparison to the evaluation of DE 41 22 189 A1 are only inexact, that is to say, there is no sense in carrying them further.

Figure 4:
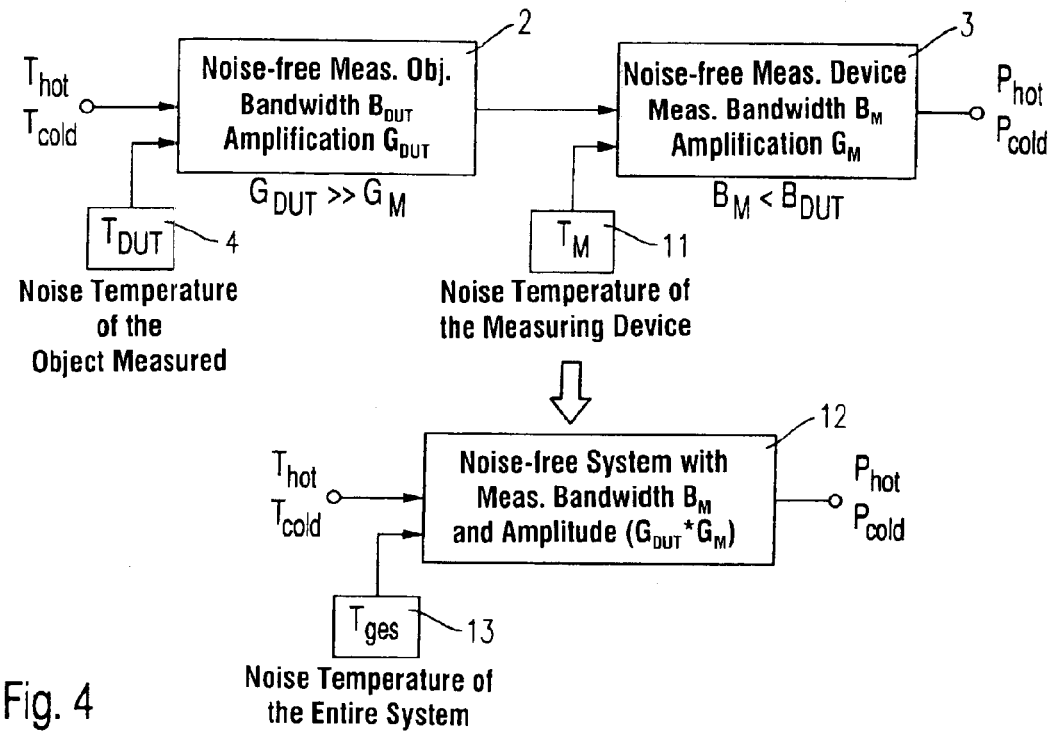

FIG. 4 shows the method of procedure in the case of the so-called Y-factor measurement. In this procedure, the object to be measured 2 which is assumed to be noise-free and at the input is provided with a noise source 4 of the noise temperature $T_{DUT}$, and the assumed noise-free measuring apparatus 3 to which is applied, at the input, a noise source 11 with the noise temperature $T_M$, is consolidated with a noise-free system 12, on the input of which is found the noise source 13 with the noise temperature $T_{ges}$.

To be assumed from this measurement is: The inherent noise of the measurement apparatus 3 was neglected, that is, the assumption was made that the noise of the object to be measured (DUT) 2 was very much greater than the noise of the measurement apparatus 2 ($T_{DUT} \approx T_{ges}$). This is always the case, if the amplification of the objects to be measured (DUTs) 2 is sufficiently large.

In the following formulae, these symbols have the meanings:

| | |
|---|---|
| $P_{cold}$ | Measured noise power with shut-off noise source |
| $P_{hot}$ | Measured noise power with connected noise source |
| $G_{DUT}$ | Amplification of the object to be measured 2 |
| $B_{DUT}$ | Bandwidth of the object to be measured 2 |
| $B_M$ | Bandwidth of the object to be measured 3 |
| $G_M$ | Amplification of the Measuring Apparatus 3, normally ≈ 1; represents the ecactness of the accuracy of the determination of the level. |

$$P_{hot} = k \cdot (G_{DUT} \cdot G_M) \cdot B_M (T_{hot} + T_{ges}) \quad (7)$$

$$P_{cold} = k \cdot (G_{DUT} G_M) \cdot B_M (T_{cold} + T_{ges}) \quad (8)$$

from which may be obtained:

$$T_{ges} = \frac{T_{hot} - Y \cdot T_{cold}}{Y - 1} \quad \text{where} \quad (9)$$

$$Y = \frac{P_{hot}}{P_{cold}} \quad (= \text{"Y} - \text{Factor}) \quad (10)$$

Figure 5:
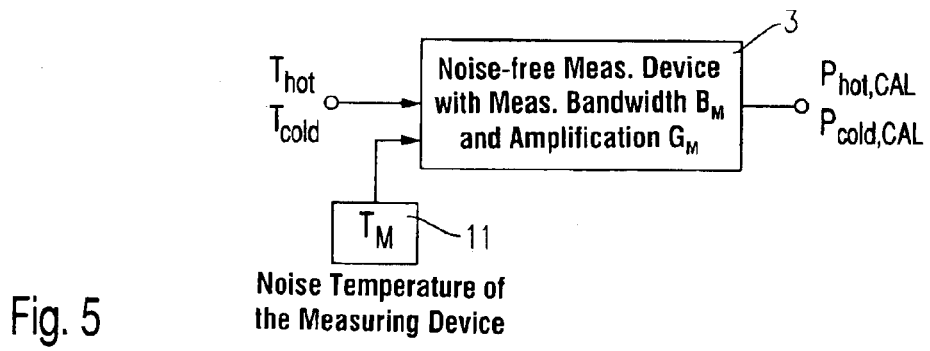
Figure 6:
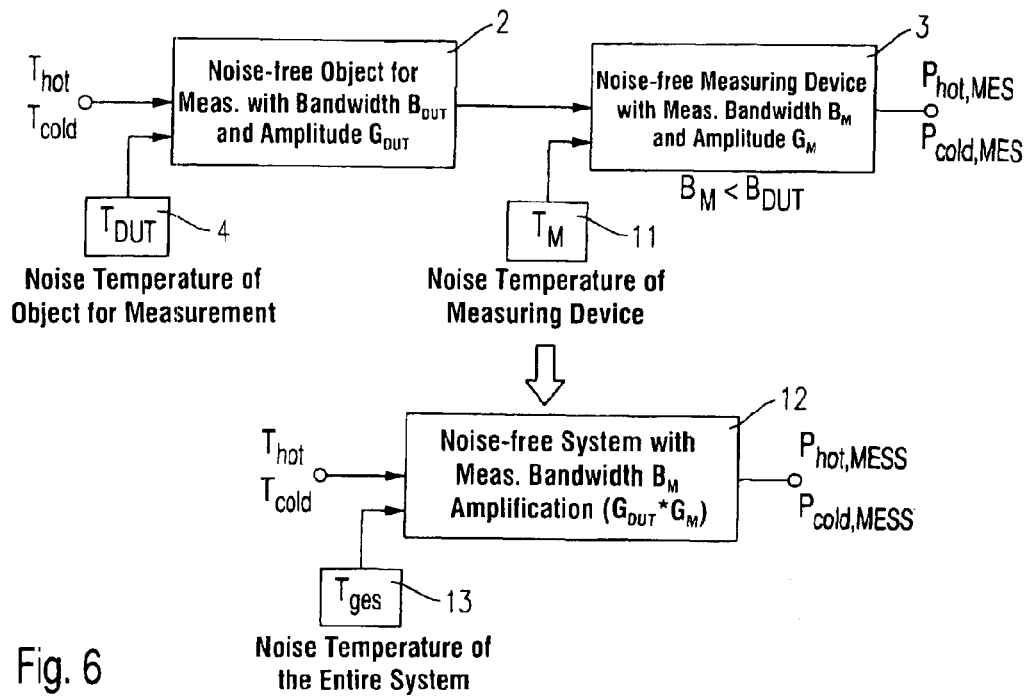

FIGS. 5 and 6 illustrate the measurement with a prior calibration. In the case of the calibration shown in FIG. 5, the measurement, the power levels $P_{hot, CAL}$ and $P_{cold, CAL}$ was measured in respect to the noise temperatures $T_{hot}$ and $T_{cold}$. In the case of the depicted measurement in FIG. 6 of the object to be measured 2, it is possible that, once again, the object to be measured 2 and the measurement apparatus 3 were together, connected to the entire system 12. The following symbols, as defined,

| | |
|---|---|
| $P_{cold, CAL}$ | Measured noise power with out-of-circuit noise source and with calibration during measurement, |
| $P_{cold, MESS}$ | Measured noise power with in-circuit noise source and with calibration during measurement, |
| $P_{Phot, MESS}$ | Measured noise power with in-circuit noise source during measurement, |
| $G_{DUT}$ | Amplification of the object to be measured 2 |
| $B_{DUT}$ | Bandwidth of the object to be measured 2 |
| $G_M$ | Amplification of the measuring apparatus 3 |
| $B_M$ | Bandwidth of the measuring apparatus 3 | serve for these equations:

$$P_{hot,CAL} = k \cdot G_M \cdot B_M \cdot (T_{hot} + T_M) \quad (11)$$

$$P_{cold,CAL} = k \cdot G_M \cdot B_M \cdot (T_{cold} + T_M) \quad (12)$$

$$P_{hot,MESS} = k \cdot (G_{DUT} \cdot G_M) \cdot B_M \cdot (T_{hot} + T_{ges}) \quad (13)$$

$$P_{cold,MESS} = k \cdot (G_{DUT} \cdot G_M) \cdot B_M \cdot (T_{cold} + T_{ges}) \quad (14)$$

The noise power of the entire system may be expressed as follows:

$$P_{noise,ges} = \underbrace{k \cdot B_M \cdot T_{ges} \cdot (G_{DUT} \cdot G_M)}_{System} = \underbrace{k \cdot B_M \cdot T_{DUT} \cdot (G_{DUT} \cdot G_M)}_{Object\ to\ be\ measured} + \underbrace{k \cdot B_M \cdot T_M \cdot G_M}_{Measuring\ Instrument} \quad (15)$$

$$\Downarrow$$

$$T_{ges} = T_{DUT} + \frac{T_M}{G_{DUT}}$$

Given the formulae (11) to (15), the noise temperature, that being $T_{DUT}$ and the amplification $G_{DUT}$ of the objects to be measured (DUTs) can be derived:

$$T_{DUT} = \frac{T_{hot} \cdot (P_{cold,MESS} - P_{cold,CAL}) - T_{cold} \cdot (P_{hot,MESS} - P_{hot,CAL})}{(P_{hot,MESS} - P_{cold,MESS})} \quad (16)$$

$$G_{DUT} = \frac{P_{hot,MESS} - P_{cold,MESS}}{P_{hot,CAL} - P_{cold,CAL}} \quad (17)$$

By using a sine reference source, such as is proposed in DE 41 22 189 A1, we may state:

$$T_{hot} = \frac{P_1}{k \cdot B_M};$$

wherein $P_1$=the greater sine power≈in-circuit source of noise, and $$T_{cold} = \frac{P_2}{k \cdot B_M};$$

wherein $P_2$=the smaller sine power≈out-of-circuit source of noise

These noise temperatures are employed in the formula (16). From which arises the following:

$$\begin{aligned}T_{DUT} &= \frac{1}{k \cdot B_M} \cdot \frac{P_1 \cdot (P_{cold,MESS} - P_{cold,CAL}) - P_2 \cdot (P_{hot,MESS} - P_{hot,CAL})}{(P_{hot,MESS} - P_{cold,MESS})} \\ &= \frac{1}{k \cdot B_M} \cdot \frac{P_1 \cdot (P_{cold,MESS} - P_{cold,CAL}) + P_2 \cdot (P_{hot,CAL} - P_{hot,MESS})}{(P_{hot,MESS} - P_{cold,MESS})}\end{aligned} \quad (18)$$

If the following be inserted:

$P_{hot,CAL}=P_{1K}$ i.e., $P_{hot,MESS}=P_{1M}$ and $P_{CAL}=P_{2,k}$ i.e., $P_{cold,MESS}=P_{2M}$ and $B_S=B_M$ then the formula can be developed which is in patent claim 1 of the DE 41 22 189 A1.

On the basis of the foregoing principles, which were explained, now the invented procedure and the difference of that to the up-to-now conventional method will be clarified.

Figure 10:
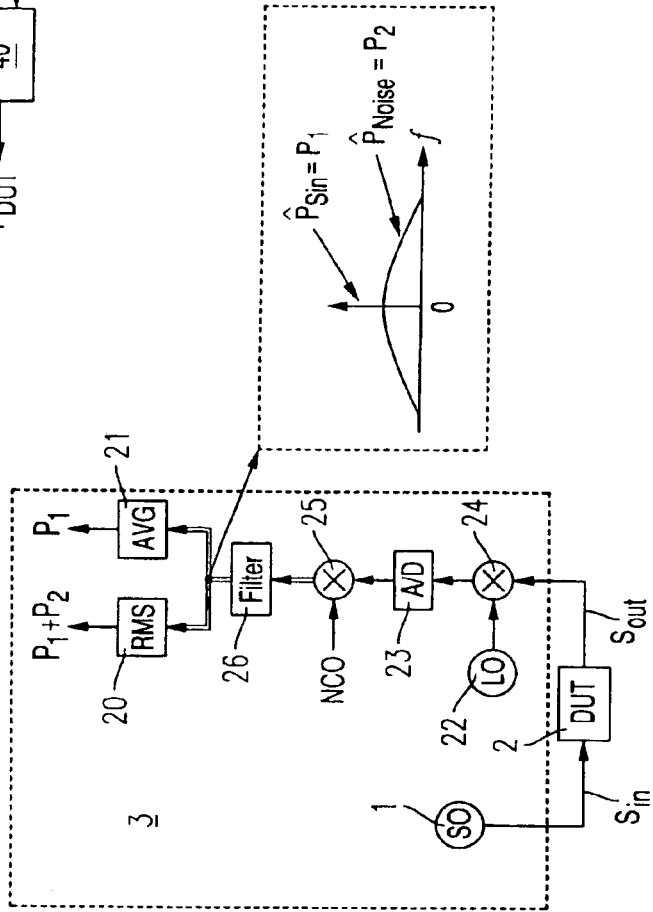

The procedure, in accord with the invention rests thereon, in that two different detectors operate in parallel in order to evaluate the mix of signals. This is shown in FIG. 10.

The first detector 20 serves only for the capture of the power level of the signal mix of sine signal and inherent noise. The measurement result will be just that much more exact, the more numerous are the numbers to be determined in the average-detector (for instance, with the root-mean-square detector 20).

The other detector 21 serves only for the capture of the power level of the sin signal out of the signal mix. Upon a greater averaging time the sine level is more exactly measured (for example with the AVG (average) detector). In this case, in the averaging, the portion of the inherent noise is averaged-out, since the inherent noise of the object to be measured 2 can be assumed as statistically independent and universally distributed.

By means of the use of two, independent, parallel operating detectors 20 and 21 the sine level can also be very much greater than the level of the inherent noise of the object to be measured 2. This is an important aspect in the practical application of the procedure, since, first, very small, but exact sine levels present a high cost of realization and second, the necessity is removed, of being obliged to repeatedly have to conform the sine level for different measuring bandwidths (representing inherent noise of different magnitudes).

The measurement of these very small power differences is achieved through the simultaneous use of the AVG-detector 21 and the RMS detector 20, in that:

with sufficient duration of the averaging time, the AVG detector 21 determines only the level of the sine signal, that is, the noise averages itself out.

the RMS detector 20 determines the total power of the sine level and the noise.

The noise power is calculated by means of taking the difference of the levels of the two detectors. Namely:

$$P_{NoiseP}=P_{RMS}-P_{AVG} \quad (19)$$

and FIG. 10 leads to:

$$P_{RMS}=P_1+P_2$$

$$P_{AVG}=P_1 \quad (20)$$

Since a level difference, of more than 70 dB was measured, it becomes necessary, that the individual level $P_{RMS}$ and $P_{AVG}$ can be measured exactly to more than $10^{-7}$. Thereby is made available on the one hand the demand for high linearity in the analog/digital transducer 23 and on the other hand the demand for an exact presentation of the measurement results.

In FIG. 10 is shown a very simplified block circuit diagram of the measurement apparatus. The sine generator 1 produces a sine signal, which is fed into the object to be measured (DUT) 2. The noise contaminated sine signal is present at the output of the said object to be measured (DUT) 2. The goal of the measurement procedure is to achieve the most possible, fault-free determination of:

1. the power $\hat{P}_{sin}$ of the sine signal, and
2. the noise power $\hat{P}_{noise}$ within the analytic bandwidth $B_{analyse}=B_M$ at the output of the object to be measured For this purpose, the output signal of the object to be measured 2 is mixed with the intermediate frequency $f_{ZF}$ in the level meter 3 by the local oscillator and the mixer 24. All interposed filters, in the interests of clarity, are not shown. Thereafter follows the sampling with the analog/digital transducer 23 with its sampling frequency of $f_{a\_in}$. The sampling frequency is, as a rule, essentially greater than the analysis bandwidth $B_{analyse}$. Therewith, the observance of the sampling theorem in regard to the analysis-bandwidth is completely fulfilled. Further, the (not shown) analog filter is so dimensioned, that no aliasing-effects enter into the noise band of interest. After the analog/digital conversion, the mix follows in the equivalent basis band through multiplication in the multiplier 25 with the complex rotational pointer $$NCO = e^{-jwZF+kT_{a\_in}}.$$

Thereafter follows a deep pass filtering with the filter 26, before the signal is evaluated with the detectors 20 and 21.

Figure 11:
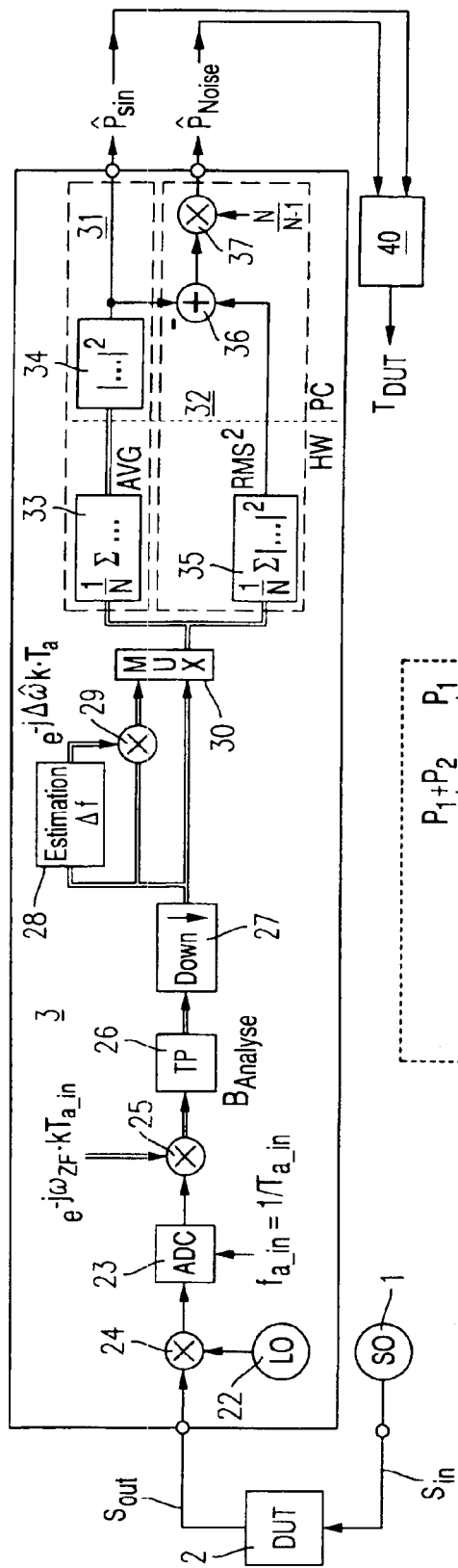

FIG. 11 shows a somewhat detailed block circuit diagram, wherein already described elements are provided with corresponding reference numbers.

As a rule, all oscillator frequencies are derived from one common reference. In this way, the sine is mixed exactly with the zero-frequency and thereby receives a discrete spectral line at the frequency f= 0. In case the sine was input externally, then the service rotary pointer still possesses a residual-frequency offset Δf. In this case, the frequency offset is stored in a subsequent signal processing block and contains the frequency value $\Delta\hat{f}$. After the mixing into the base band, the analysis filtering is carried out with prescribed analysis bandwidth $B_{analyse}$. This filter 26 has, among other things, the task of repressing the back-looping through the mix in the base band. The spectrum of the output signal consists of the discrete spectral lines by the sine at zero frequency and the band limited noise, which is schematically presented in FIG. 10. Following the maximum-likelihood-theory, the optimal estimator requires (for instance, the noise portion) only non-correlated sample values. In the following, the sampling frequency should be chosen in the general magnitude of:

$$f_a = B_{analyse} \quad (21)$$

A greater sampling rate does not contribute to an optimal estimation. A lesser sampling leads to uncorrelated sample values, but, with equally estimation errors, requires a correspondingly greater measuring time. As a result, after the filtering a down-sampling in accord with $$\text{Down} = \frac{f_{a\_in}}{fa} \quad (22)$$

can be carried out in the down-sampler 27. In regard to a reduction of the signal processing expense, one is recommended to integrate the decimation immediately in the analysis filter 26, that is, only the analysis output samples are to be calculated, which are used after the decimation.

After the down-sampling, there follows optionally, with the external sine generator 1, the estimation of the frequency offset Δf with the subsequent compensation (see above). For the sake of simplicity, for the following considerations, the assumption will be made, that the frequency estimation device 28 estimates without fault and thereby, after the compensation likewise a discrete spectral line will be present when the frequency is a zero. The correction with the correction factor $e^{-j\Delta\hat{\omega}k\cdot T_a}$ follows in the multiplier 29. The multiplexer 30 enables an optional ON/OFF switching of the frequency correction.

Subsequently, the digital result has been obtained:

$$R(K) = \underbrace{A \cdot e^{j\varphi}}_{:=c} + n(k)$$

The equal portion possesses the amplitude A and the phase φ, which is brought about by the phase offset between the sine generator and the local generator 22. For the following computations, it is recommended, that the complex constant c in accord with equation (23) be defined. The power of interest of the equal portion is found by:

$$P_{sin} = |c|^2 \quad (24)$$

Further, the band-limited noise n(k) with the analysis bandwidth $B_{analyse}$ of the object to be measured 2 has the average noise power of:

$$P_{noise} = E\{|n(k)|^2\} \quad (25)$$

wherein E { . . . } represents the expected value.

The following signal processing has the purpose, of determining, from a limited period of observation of N samples, the optimal estimated value $\hat{P}_{sin}$ and $\hat{P}_{noise}$. The "hat" ^ denotes general estimation values. The tilde denotes generally a trial parameter.

First, $P_{sin}$ is estimated by the use of the maximum-likelihood-theory. In this, the complex equal portion c is estimated from equation (23). This is done by means of minimizing the log-likelihood-function:

$$L(\tilde{c}) = \sum_{k=1}^{N} |r(k) - \tilde{c}|^2 \quad (26)$$

and the estimated value appears as:

$$\hat{c} = \underbrace{1/N \cdot \sum_{k=1}^{N} r(k)}_{:=AVG} \quad (27)$$

By the placement of equation (27) in equation (24), the desired estimation value of the sine power, in accord with:

$$\hat{P}_{sin} = \underbrace{|\hat{c}|^2}_{|AVG|^2} \quad (28)$$

Subsequently, $\hat{P}_{noise}$ is to be estimated. To this end, equation (27) is incorporated into equation (26), giving:

$$L(\hat{c}) = \sum_{k=1}^{N} \left| r(k) - 1/N \cdot \sum_{k'=1}^{N} r(k') \right|^2 \quad (29)$$

As is known, L possesses a chi-square distribution with the degree of freedom 2·(N−1). The factor 2 enters into the degree of freedom, because the samples are complex. As a result, L is relieved of the equal portion and is, absent a normalizing factor, the best possible estimated value of the sought after noise power $\hat{P}_{noise}$. Thereby the estimation true to that expected regarding the noise power is available through:

$$\hat{P}_{noise} = \frac{1}{N-1} \cdot L(\hat{c}) \quad (30)$$

By the incorporation of equation (29), we have:

$$\hat{P}_{noise} = \frac{1}{N-1} \cdot \sum_{k=1}^{N} \left| r(k) - 1/N \cdot \sum_{k'=1}^{N} r(k') \right|^2$$

-continued $$= \frac{1}{N-1} \cdot \sum_{k=1}^{N} |r(k)|^2 - \frac{2}{N-1} \cdot$$

$$\underbrace{Re\left\{1/N \sum_{k=1}^{N} \sum_{k'=1}^{N} r(k) \cdot r^*(k')\right\}}_{1/N |\Sigma_{k=1}^{N} r(k)|^2} + \frac{1}{N-1} \cdot N/N^2 \cdot \left|\sum_{k=1}^{N} r(k)\right|^2$$

and consolidating the second and third terms, we have:

$$\hat{P}_{noise} = \frac{1}{N-1} \cdot \sum_{k=1}^{N} |r(k)|^2 - \frac{1}{N-1} \cdot 1/N \left|\sum_{k=1}^{N} r(k)\right|^2 \quad (31)$$

For the implementation, the extension with N/N is carried out, giving:

$$\hat{P}_{noise} = \frac{N}{N-1} \cdot \left[ \underbrace{\frac{1}{N} \cdot \sum_{k=1}^{N} |r(k)|^2}_{:=RMS^2} - \underbrace{\left|1/N \cdot \sum_{k=1}^{N} r(k)\right|^2}_{:=AVG} \right] \quad (32)$$

whereby, RMS² is the total power and AVG is the estimated complex equal, portion.

The associated realizations from equations (28) and (32) are shown by components of the digital signal processing in FIG. 11.

The partitioning proposed in FIG. 11 between hardware HW and software in a PC computer has the advantage, that
- the RMS² and the AVG can be computed by rapid hardware logic in real time. The result is, no intermediate storage of the result r(k) is necessary. Such storage is generally necessary by the use of large N-values, and
- the following | ... |² operation as well as the subtraction and multiplication can be done in a PC computer or digital signal processor. A resource incentive, hardware-realization is not sensible, because these computations need be carried out only once within N samples, and on this account no high demands are placed on the computer speed.

In FIG. 11 is the block circuit diagram of the level meter 3 resulting from the above. At the down-sampler 27 or the multiplexer 30, there is connected a sine-power-level detector 31 for the capture of the sine power level $\hat{P}_{sin}$ and a noise power level detector 32 for a separate capture therefrom of the noise power level $\hat{P}_{noise}$.

The sine power level detector 31 consists of an averager 33, which forms the arithmetical average AVG of N samples. Thereby, the N samples are added and the sum divided by 1/N. The division can also be eliminated, if the renormalization at the signal $\hat{P}_{sin}$ is given consideration. The amount of the arithmetical average is subsequently squared in a squaring device 34. At the output of the squaring device the sine power level $\hat{P}_{sin}$ is available.

The noise power level detector 32 consists of a squaring average device 35. This squares first the amount of the sample and then adds N samples. The sum is then divided by the number N of the samples. Even in this case, the division by N can be omitted, if the renormalization in the output $\hat{P}_{noise}$ has been correspondingly considered. The noise power level $\hat{P}_{noise}$ may be obtained, in that in the subtractor 36, the sine power level $\hat{P}_{sin}$ is subtracted from the squared average value RMS² of the squaring averager 35. In a multiplier it is still possible to rectify the correction factor N/(N−1), which is available from the equation (32). If a plurality of sample N are brought into the averaging process, then this factor approaches 1 and this rectification can possibly be omitted.

For the judgment of the necessary time of observation N, as an example, the 99% confidence-interval of the estimation of $\hat{P}_{noise}$ is given. It is obvious, that the 99% confidence-interval of $\hat{P}_{noise}$ can be obtained from:

$$99\% \text{ confidential of } \hat{P}_{noise} = 10 \cdot \log_{10}\left(1 - 2.5758 \cdot \sqrt{\frac{1}{N-1}}\right) \text{(dB)} \quad (33)$$

In FIG. 12, the 99% confidence interval is graphically depicted in relation to N. This can be made more clear by the following example:

In an observation interval of N=1.4·10⁵ samples, there can be determined from FIG. 12, a 99% confidence interval of 0.1 dB. This means, that the estimated noise power level $\hat{P}_{noise}$ deviates from the true noise power level $\hat{P}_{noise}$ by less than ±0.1 dB. If one employs, for instance, a measuring bandwidth of $B_{analyse}$=1 MHz, then, in accord with equation (21) there is a sampling period of $T_o$=1 μs. At this bandwidth, there may be found an observation time of only:

$$T_{beob} = N \cdot T_o$$
$$= 1.4 \cdot 10^5 \cdot 1 \text{ μs}$$
$$= 0.14 \text{ s}$$

The example demonstrates the enormous exactness of the measurement at a higher speed of measuring, which is made clear by the power capability of the procedure.

In the following will be explained how the noise temperature of the object to be measured 2 can be computed from the now so obtained sine power level $\hat{P}_{sin}$ and the noise power level $\hat{P}_{noise}$ in an evaluation device 40, which is a component of a PC computer or a digital signal processor DSP.

First, a possibility for the determination of the noise temperature $T_{DUT}$ without prior calibration is presented. In the case of this measurement, the following assumptions are held:

The inherent noise of the measuring apparatus (level meter) 3 is dismissed, that is, the assumption is that the noise of the object to be measured (DUT) 2 is very much greater than the noise of the measuring apparatus 3 ($T_{DUT} \gg T_{GES}$). This is always the case, if the amplification of the object to be measured 2 is sufficiently great.

Figure 7:
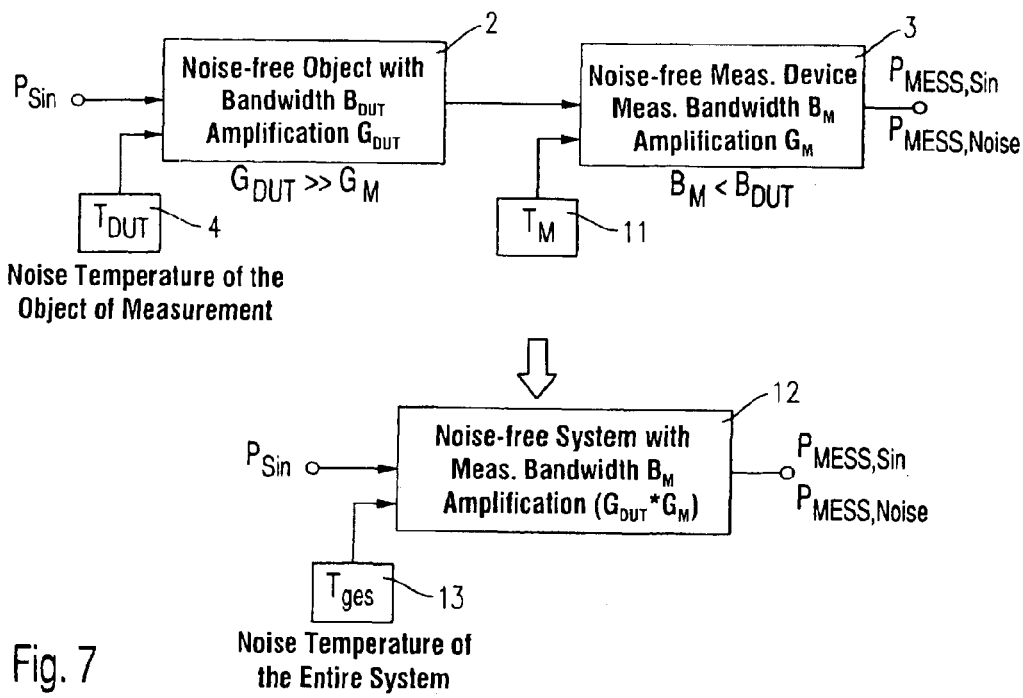

With the values shown in FIG. 7, wherein:

| | |
|---|---|
| $P_{sin}$ | level of the sine reference source 1 |
| $P_{Mess, Sin}$ | measured sine level |
| $P_{Mess, Noise}$ | measured noise level |
| $G_{DUT}$ | amplification of the object to be measured 2 |
| $B_{DUT}$ | bandwidth of the object to be measured 2 |
| $B_M$ | bandwidth of the measuring apparatus (level meter) 3 |
| $G_M$ | amplification of the measuring apparatus (level meter) 3 (normally this value ≈ 1; represents the degree of accuracy of the level determination. | which permits these statements:

$$P_{MESS,sin} = P_{sin} \cdot (G_{DUT} \cdot G_M) = P_{sin} \cdot G_{ges} \quad (34)$$

$$P_{MESS,Noise} = k \cdot T_{ges} \cdot B_M \cdot (G_{DUT} \cdot G_M) = k \cdot T_{ges} \cdot B_M \cdot G_{ges} \quad (35)$$

whence the following is derived:

$$T_{ges} = \frac{P_{sin}}{k \cdot B_M} \cdot \frac{P_{MESS,Noise}}{P_{MESS,sin}} \gg T_{DUT} \quad (36)$$

$$G_{ges} = \frac{P_{MESS,sin}}{P_{sin}} \approx G_{DUT} \quad (37)$$

The bandwidth of the measuring apparatus $B_M$ must be known exactly. With modern measuring apparatuses this is no problem, since the bandwidths are produced either entirely digitally or are calibrated.

In the following, a more precise determination of the noise temperature $T_{DUT}$ of the object to be measured 2 is given with consideration paid to a calibration made prior to the measurement.

Figure 8:
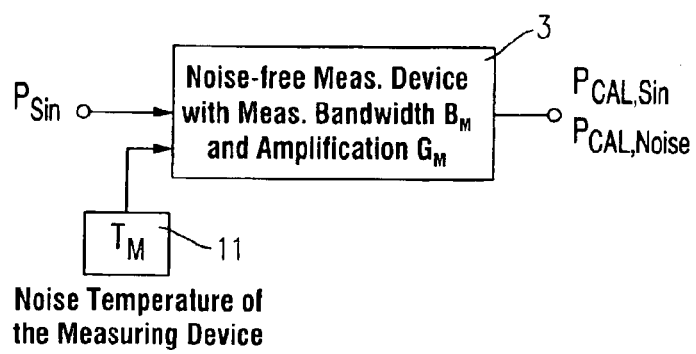
Figure 9:
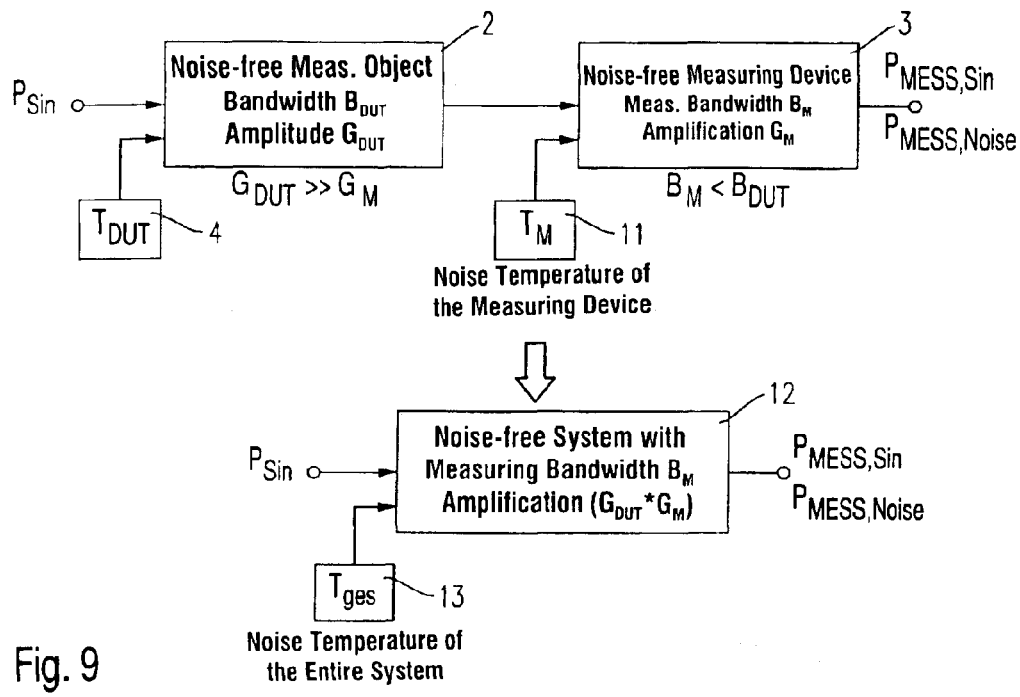

Given the following described items in FIG. 8 and FIG. 9:

| | |
|---|---|
| $P_{sin}$ | level of the sine reference source 1 |
| $P_{CAL,sin}$ | measured sine level at the calibration |
| $P_{MESS,sin}$ | measured sine level at the measurement |
| $P_{CAL,noise}$ | measured noise power at the calibration |
| $P_{Mess,noise}$ | measured noise power at the measurement |
| $G_{DUT}$ | amplification of the object to be measured 2 |
| $B_{DUT}$ | band width of the object to be measured 2 |
| $G_M$ | amplification of the measurement apparatus (level meter) 3 |
| $B_M$ | bandwidth of the measurement apparatus (level meter) 3 |

The following equations can be established:

$$P_{CAL,sin} = P_{sin} \cdot G_M \quad (38)$$

$$P_{CAL,noise} = k \cdot T_M \cdot B_M \cdot G_M \quad (39)$$

$$P_{MESS,sin} = P_{sin} \cdot (G_{DUT} \cdot G_M) = P_{sin} \cdot G_{ges} \quad (40)$$

$$P_{MESS,noise} = k \cdot T_{ges} \cdot B_M \cdot (G_{DUT} \cdot G_M) = k \cdot T_{ges} \cdot B_M \cdot G_{ges} \quad (41)$$

The noise power of the entire system permits the following to be presented:

$$P_{noise,ges} = \quad (42)$$

$$\underbrace{k \cdot B_M \cdot T_{ges} \cdot (G_{DUT} \cdot G_M)}_{System} = \underbrace{k \cdot B_M \cdot T_{DUT} \cdot (G_{DUT} \cdot G_M)}_{Object\ to\ be\ measured} + \underbrace{k \cdot B_M \cdot T_M \cdot G_M}_{Measuring\ Instrument}$$

$$\Downarrow$$

$$T_{ges} = T_{DUT} + \frac{T_M}{G_{DUT}} \quad (43)$$

With the formulae (38) to (43) there is made available the noise temperature $T_{DUT}$ and the amplification $G_{DUT}$ of the object to be measured 2, with the following equations:

$$T_{DUT} = \frac{P_{sin}}{k \cdot B_M} \cdot \frac{(P_{MESS,noise} - P_{CAL,noise})}{P_{MESS,sin}} \quad (44)$$

$$G_{DUT} = \frac{P_{MESS,sin}}{P_{CAL,sin}} \quad (45)$$

The invented procedure and the apparatus enables a very accurate measurement for both the noise temperature as will and the amplification of the object to be measured. Further it is of advantage, that the noise value magnitudes can be measured even at a high excitation of the object to be measured. For instance, an amplifier in the full modulated state can be measured, which is not possible with the procedure in accord with the state of the technology.

What is claimed is:

1. A process for determining a magnitude of a noise of an electronic object to be measured, said process comprising:

inputting an unmodulated sine signal ($S_{in}$) into the electronic object; and measuring an associated power level with a level meter, wherein (a) the level meter determines a sine power level ($\hat{P}_{sin}$) and a noise power level ($\hat{P}_{noise}$) separately, (b) the magnitude of the noise is the noise temperature $T_{DUT}$ of the object to be measured, and the (c) noise temperature $T_{DUT}$ is determined by the formula:

$$T_{DUT} = \frac{P_{sin}}{k \cdot B_M} \cdot \frac{P_{MESS,noise}}{P_{MESS,sin}}$$

where

| | |
|---|---|
| $P_{sin}$ | is the power level of the sine signal at the input to the object to be measured, |
| $P_{MESS,sin}$ | is the power level of the sine measured with intermediate circuitous inclusion of the object to be measured as measured with the level meter |
| $P_{MESS,Noise}$ | is the power level of the noise measured with intermediate circuitous inclusion of the object to be measured as measured with the level meter |
| $P_{CAL,noise}$ | the power level of the noise measured without intermediate circuitous inclusion of the object to be measured as measured with the level meter |
| k | the Boltzmann Constant, and |
| $B_M$ | is a bandwidth of the level meter. |

2. The process of claim 1, wherein the level meter takes samples of output signals ($S_{out}$) and determines a sample value from the sine power level, ($\hat{P}_{sin}$) by taking an arithmetical average of the samples and subsequent squaring of an amount of an arithmetical average of the samples.

3. The process of claim 2, wherein the noise power level is obtained by taking an arithmetical average of the amount squared of the samples and subsequent subtraction of the sine power level ($\hat{P}_{sin}$).

4. The process of claim 2, wherein prior to taking the average value, an estimation and a revision of a deviation of a frequency of the input sine signal ($S_{in}$) from a frequency of an available local oscillator in the level meter are carried out.

5. A process for determining a magnitude of a noise of an electronic object to be measured, said process comprising:

inputting an unmodulated sine signal ($S_{in}$) into the electronic object; and measuring an associated power level with a level meter, wherein (a) the level meter determines a sine power level ($\hat{P}_{sin}$) and a noise power level ($\hat{P}_{noise}$) separately, (b) a calibration precedes the measurement, in which the sine signal ($S_{in}$) has a level identical to a measurement level; (c) the sine signal is input directly into the level meter circuitously bypassing the object to be measured; (d) the magnitude of the noise is the noise temperature $T_{DUT}$; and (e) the noise temperature $T_{DUT}$ of the object to be measured is determined by the formula:

$$T_{DUT} = \frac{P_{sin}}{k \cdot B_M} \cdot \frac{(P_{MESS,noise} - P_{CAL,noise})}{P_{MESS,sin}}$$

wherein

| | |
|---|---|
| $P_{sin}$ | is the power level of the sine signal at the input to the object to be measured, |
| $P_{MESS,sin}$ | is the power level of the sine measured with intermediate circuitous inclusion of the object to be measured as measured with the level meter |
| $P_{MESS,Noise}$ | is the power level of the noise measured with intermediate circuitous inclusion of the object to be measured as measured with the level meter |
| $P_{CAL,noise}$ | the power level of the noise measured without intermediate circuitous inclusion of the object to be measured as measured with the level meter |
| k | the Boltzmann Constant, and |
| $B_M$ | is a bandwidth of the level meter. |

6. An apparatus for determining a magnitude of a noise of an electronic object to be measured, said apparatus comprising:

a sine-signal source adapted to produce an unmodulated sine signal which is to be input into the object to be measured; and A level meter for measuring a power level at an output of the object to be measured, wherein (a) the level meter is equipped with a sine power level detector device for separately and discretely capturing a sine power level $\hat{P}_{sin}$ and a noise power level detector device for capturing a noise power level ($\hat{P}_{noise}$), (b) the magnitude of the noise is the noise temperature $T_{DUT}$ and (c) an evaluator is adapted to determine the noise temperature $T_{DUT}$ of the object to be measured using the formula:

$$T_{DUT} = \frac{P_{sin}}{k \cdot B_M} \cdot \frac{(P_{MESS,noise})}{P_{MESS,sin}}$$

wherein:

| | |
|---|---|
| $P_{sin}$ | is the power level of the sine signal at the input to the object to be measured, |
| $P_{MESS,sin}$ | is the power level of the sine measured with intermediate circuitous inclusion of the object to be measured as measured with the level meter |
| $P_{MESS,Noise}$ | is the power level of the noise measured with intermediate circuitous inclusion of the object to be measured as measured with the level meter |
| $P_{CAL,noise}$ | the power level of the noise measured without intermediate circuitous inclusion of the object to be measured as measured with the level meter |
| k | the Boltzmann Constant, and |
| $B_M$ | is a bandwidth of the level meter. |

7. The apparatus of claim 6, wherein the level meter captures samples of an output signal at the object to be measured and the sine power level detector device determines the sine-power level $\hat{P}_{sin}$ by taking an arithmetical average of the samples and subsequent squaring of an amount of an arithmetic average value of the samples.

8. The apparatus of claim 7, wherein the noise power level detector device determines the noise power level ($\hat{P}_{noise}$) by taking an arithmetical average of a square of an amount of a sample and subsequent subtraction of the sine power level $\hat{P}_{sin}$.

9. The apparatus of claim 7, wherein the level meter has a frequency estimation device which, prior to taking the average undertakes an estimation of a frequency deviation between the frequency of the sine signal input into the object to be measured, a frequency of a local oscillator present in the level meter, and a frequency correction device, which rectifies the said frequency deviation.

10. An apparatus for determining a magnitude of a noise of an electronic object to be measured, said apparatus comprising:

a sine-signal source adapted to produce an unmodulated sine signal which is to be input into the object to be measured; and a level meter for measuring a power level at an output of the object to be measured, wherein (a) the level meter is equipped with a sine power level detector device for separately and discretely capturing a sine power level $\hat{P}_{sin}$ and a noise power level detector device for capturing a noise power level ($\hat{P}_{noise}$),and a calibration precedes the measurement, in the case of which the sine signal is input directly into the level meter at a level identical to a measurement level determined by the measurement without an intermediate routing through the object to be measured; (c) the magnitude of the noise is the noise temperature $T_{DUT}$; and (d) an evaluation device determines the noise temperature $T_{DUT}$ of the object to be measured in accord with the formula:

$$T_{DUT} = \frac{P_{sin}}{k \cdot B_M} \cdot \frac{(P_{MESS,noise} - P_{CAL,noise})}{P_{MESS,sin}}$$

wherein:

| | |
|---|---|
| $P_{sin}$ | is the power level of the sine signal at the input of the object to be measured, |
| $P_{MESS,sin}$ | is the sine power level with circuitous inclusion of the object to be measured as measured with the level meter, |
| $P_{MESS,noise}$ | is the noise power level with circuitous inclusion of the object to be measured, as measured with the level meter, |
| $P_{CAL,noise}$ | is the noise power level without circuitous inclusion of the object to be measured, as measured with the level meter, |
| k | is the Boltzmann Constant, and |
| $B_M$ | is a bandwidth of the level meter. |

11. A process for determining a magnitude of a noise of an electronic object to be measured, said process comprising:

inputting a sine signal ($S_{in}$) into the electronic object; and measuring an associated power level with a level meter, wherein an estimation and a revision of a deviation of a frequency of the input sine signal ($S_{in}$) from a frequency of an available local oscillator in the level meter are carried out the magnitude of the noise is the noise temperature $T_{DUT}$ of the object to be measured, and the noise temperature $T_{DUT}$ is determined by the formula:

$$T_{DUT} = \frac{P_{sin}}{k \cdot B_M} \cdot \frac{P_{MESS,noise}}{P_{MESS,sin}}$$

where

| | |
|---|---|
| $P_{sin}$ | is a power level of the sine signal at the input of the object to be measured |

-continued

| | |
|---|---|
| $P_{MESS,sin}$ | is a sine power level as measured with the level meter |
| $P_{MESS,noise}$ | is a noise power level measured with the level meter |
| k | is the Boltzmann Constant, and |
| $B_M$ | is a bandwidth of the level meter. |

12. The process of claim 11, wherein the level meter determines a sine power level ($\hat{P}_{sin}$) and a noise power level ($\hat{P}_{noise}$) separately.

13. The process of claim 12, wherein the level meter takes samples of output signals ($S_{out}$) and determines a sample value from the sine power level, ($\hat{P}_{sin}$) by taking an arithmetical average of the samples and subsequent squaring of an amount of an arithmetical average of the samples.

14. The process of claim 13, wherein the noise power level is obtained by taking an arithmetical average of the amount squared of the samples and subsequent subtraction of the sine power level ($\hat{P}_{sin}$).

15. A process for determining a magnitude of a noise of an electronic object to be measured, said process comprising:

inputting a sine signal ($S_{in}$) into the electronic object; and measuring an associated power level with a level meter, wherein (a) an estimation and a revision of a deviation of frequency of the input sine signal ($S_{in}$) from a frequency of an available local oscillator in the level meter are carried out, (b) a calibration precedes the measurement, in which the sine signal ($S_{in}$) has a level identical to a measurement level; (c) the sine signal is input directly into the level meter circuitously by-passing the object to be measured; (d) the magnitude of the noise is the noise temperature $T_{DUT}$; and (e) the noise temperature $T_{DUT}$ of the object to be measured is determined by the formula:

$$T_{DUT} = \frac{P_{sin}}{k \cdot B_M} \cdot \frac{(P_{MESS,noise} - P_{CAL,noise})}{P_{MESS,sin}}$$

wherein

| | |
|---|---|
| $P_{sin}$ | is the power level of the sine signal at the input to the object to be measured, |
| $P_{MESS,sin}$ | is the power level of the sine measured with intermediate circuitous inclusion of the object to be measured as measured with the level meter |
| $P_{MESS,Noise}$ | is the power level of the noise measured with intermediate circuitous inclusion of the object to be measured as measured with the level meter |
| $P_{CAL,noise}$ | the power level of the noise measured without intermediate circuitous inclusion of the object to be measured as measured with the level meter |
| k | the Boltzmann Constant, and |
| $B_M$ | is a bandwidth of the level meter. |

16. An apparatus for determining a magnitude of a noise of an electronic object to be measured, said apparatus comprising:

a sine-signal source adapted to produce a sine signal which is to be input into the object to be measured; and a level meter for measuring a power level at an output of the object to be measured, wherein (a) the level meter is equipped with
a sine power level detector device for separately and discretely capturing a sine power level $\hat{P}_{sin}$,
a noise power level detector device for capturing a noise power level ($\hat{P}_{noise}$),
a frequency estimation device which, undertakes an estimation of a frequency deviation between the frequency of the sine signal input into the object to be measured and a frequency of a local oscillator present in the level meter, and
a frequency correction device, which rectifies the frequency deviation, and (b) the magnitude of the noise is the noise temperature $T_{DUT}$ and an evaluator is adapted to determine the noise temperature $T_{DUT}$ of the object to be measured using the formula:

$$T_{DUT} = \frac{P_{sin}}{k \cdot B_M} \cdot \frac{(P_{MESS,noise})}{P_{MESS,sin}}$$

wherein:

| | |
|---|---|
| $P_{(sin)}$ | is the power level of the sine signal at the input to the object to be measured, |
| $P_{(MESS,sin)}$ | is the power level of the sine measured with intermediate circuitous inclusion of the object to be measured as measured with the level meter, |
| $P_{MESS,Noise}$ | is the power level of the noise measured with intermediate circuitous inclusion of the object to be measured as measured with the level meter, |
| $P_{CAL,noise}$ | the power level of the noise measured without intermediate circuitous inclusion of the object to be measured as measured with the level meter, |
| k | the Boltzmann Constant, and |
| $B_M$ | is a bandwidth of the level meter. |

17. The apparatus of claim 16, wherein the level meter captures samples of an output signal at the object to be measured and the sine power level detector device determines the sine-power level $\hat{P}_{sin}$ by taking an arithmetical average of the samples and subsequent squaring of an amount of an arithmetic average value of the samples.

18. The apparatus of claim 17, wherein the noise power level detector device determines the noise power level ($\hat{P}_{noise}$) by taking an arithmetical average of a square of an amount of a sample and subsequent subtraction of the sine power level $\hat{P}_{sin}$.

19. An apparatus for determining a magnitude of a noise of an electronic object to be measured, said apparatus comprising:

a sine-signal source adapted to produce a sine signal which is to be input into the object to be measured; and a level meter for measuring a power level at an output of the object to be measured, wherein (a) the level meter is equipped with
a sine power level detector device for separately and discretely capturing a sine power level $\hat{P}_{sin}$,
a noise power level detector device for capturing a noise power level ($\hat{P}_{noise}$),
a frequency estimation device which, undertakes an estimation of a frequency deviation between the frequency of the sine signal input into the object to be measured and a frequency of a local oscillator present in the level meter, and
a frequency correction device, which rectifies the frequency deviation, (a) calibration precedes the measurement, in the case of which the sine signal is input directly into the level meter at a level identical to a measurement level determined by the measurement without an intermediate routing through the object to be measured;

(c) the magnitude of the noise is the noise temperature $T_{DUT}$; and (d) an evaluation device determines the noise temperature $T_{DUT}$ of the object to be measured in accord with the formula:

$$T_{DUT} = \frac{P_{sin}}{k \cdot B_M} \cdot \frac{(P_{MESS,noise} - P_{CAL,noise})}{P_{MESS,sin}}$$

wherein:

| | |
|---|---|
| $P_{sin}$ | is the power level of the sine signal at the input to the object to be measured, |
| $P_{MESS,sin}$ | is the power level of the sine measured with intermediate circuitous inclusion of the object to be measured as measured with the level meter |
| $P_{MESS,Noise}$ | is the power level of the noise measured with intermediate circuitous inclusion of the object to be measured as measured with the level meter |
| $P_{CAL,noise}$ | the power level of the noise measured without intermediate circuitous inclusion of the object to be measured as measured with the level meter |
| k | the Boltzmann Constant, and |
| $B_M$ | is a bandwidth of the level meter. |

\* \* \* \* \*